United States Patent [19]

Rolf

[11] Patent Number: 4,698,026

[45] Date of Patent: Oct. 6, 1987

[54] TERMINAL CONNECTION PIN FOR SOLDERLESS CONNECTIONS

[75] Inventor: Helmut Rolf, Feucht, Fed. Rep. of Germany

[73] Assignee: Leonhardy GmbH, Fed. Rep. of Germany

[21] Appl. No.: 920,524

[22] Filed: Oct. 17, 1986

[30] Foreign Application Priority Data

Oct. 18, 1985 [DE] Fed. Rep. of Germany ....... 3537164

[51] Int. Cl.[4] .......................................... H01R 13/428
[52] U.S. Cl. ....................................... 439/82; 439/751
[58] Field of Search ............ 339/17 C, 220 R, 220 A, 339/220 C, 220 L, 220 T, 221 R, 221 M, 252 R, 252 P

[56] References Cited

U.S. PATENT DOCUMENTS

| 2,006,813 | 7/1935 | Norwood | 339/221 R |
| 3,897,131 | 7/1975 | Stauffer | 339/220 R |
| 4,469,394 | 9/1984 | Verhoeven | 339/221 R |

FOREIGN PATENT DOCUMENTS

| 0105044 | 4/1984 | European Pat. Off. | |
| 2523448 | 12/1976 | Fed. Rep. of Germany | 339/221 R |
| 2624330 | 12/1977 | Fed. Rep. of Germany | 337/17 C |
| 2713728 | 10/1978 | Fed. Rep. of Germany | 339/17 C |
| 2937883 | 4/1981 | Fed. Rep. of Germany | |

Primary Examiner—Gil Weidenfeld
Assistant Examiner—Gary F. Paumen
Attorney, Agent, or Firm—Thomas W. Speckman; Ann W. Speckman

[57] ABSTRACT

A terminal connection pin for solderless connections comprising a press-fit section which is insertable into a contact through bore of a printed circuit board to provide a solderless electrical and mechanical connection between the terminal connection pin and the contact through bore of the printed circuit board, wherein the terminal connection pin has a generally square cross section with an enlarged press-fit section having a groove extending parallel to its longitudinal axis and providing at least two contact paths in an axial direction which are opposite one another and have a limited flexibility. The terminal connection pin provides excellent holding force, and sufficient contact forces across the length of the contact through bore can be achieved by contouring the outer surfaces of the lateral areas and rear area of the press-fit section, with respect to the groove, in the form of peaks and valleys extending in an axial direction, where the distance between the peaks serving as contact points corresponds to half the thickness of the printed circuit board, and where the peaks of the rear area are aligned with the valleys of the lateral areas and the valleys of the rear area are aligned with the peaks of the lateral areas.

10 Claims, 12 Drawing Figures

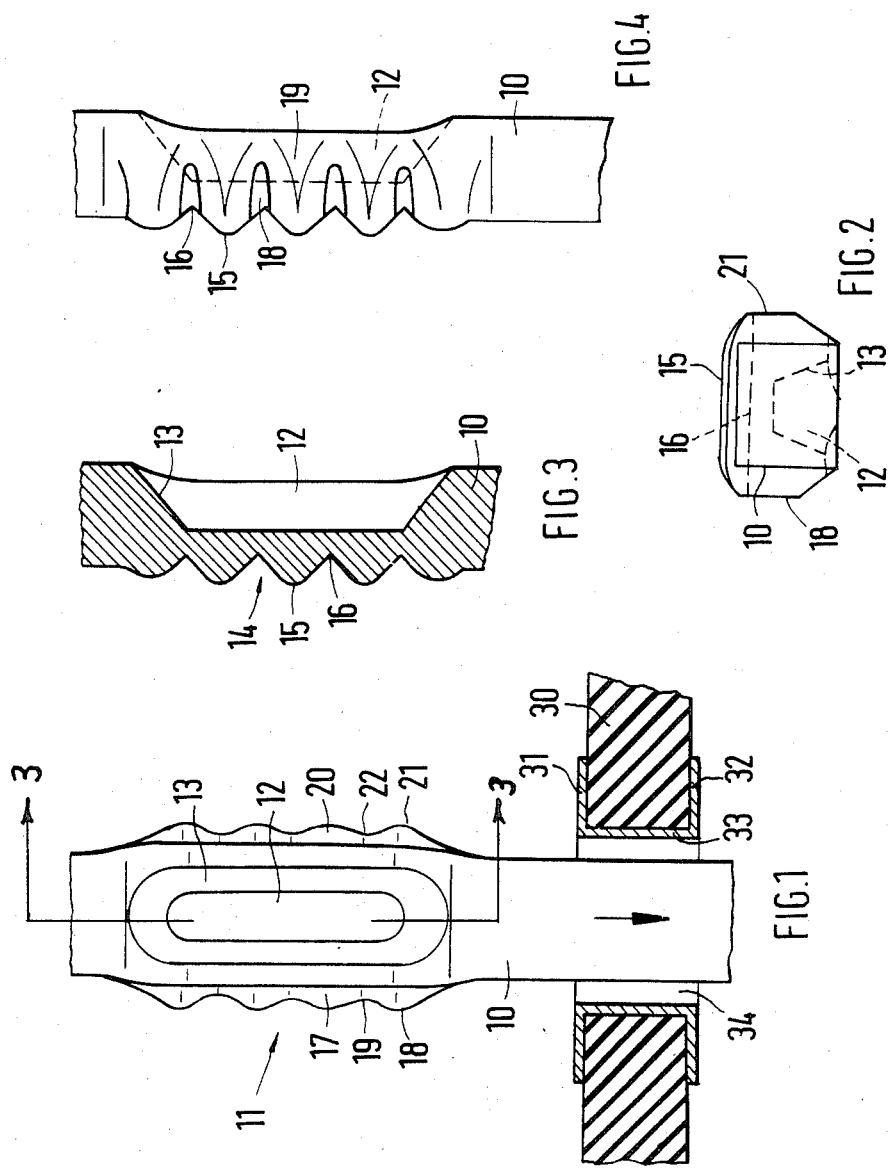

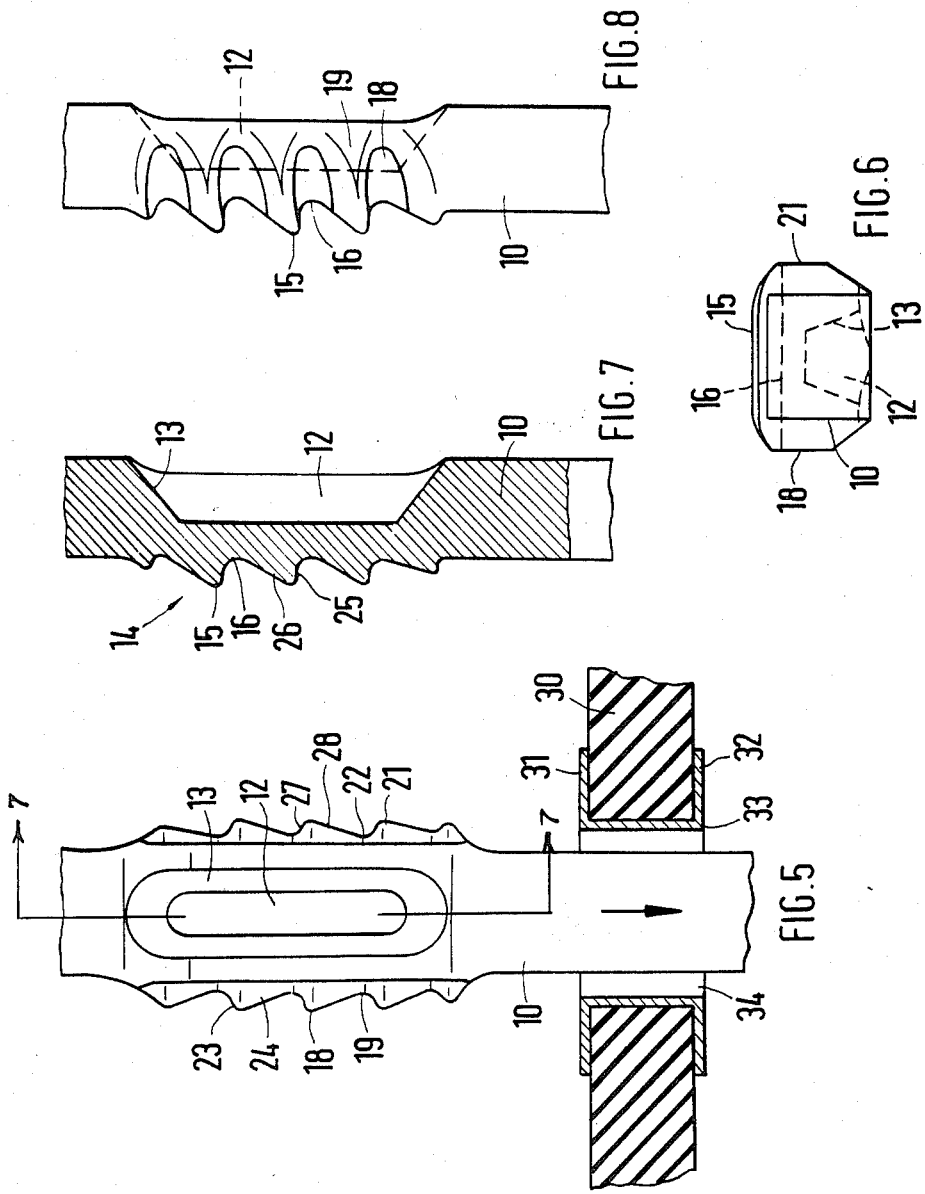

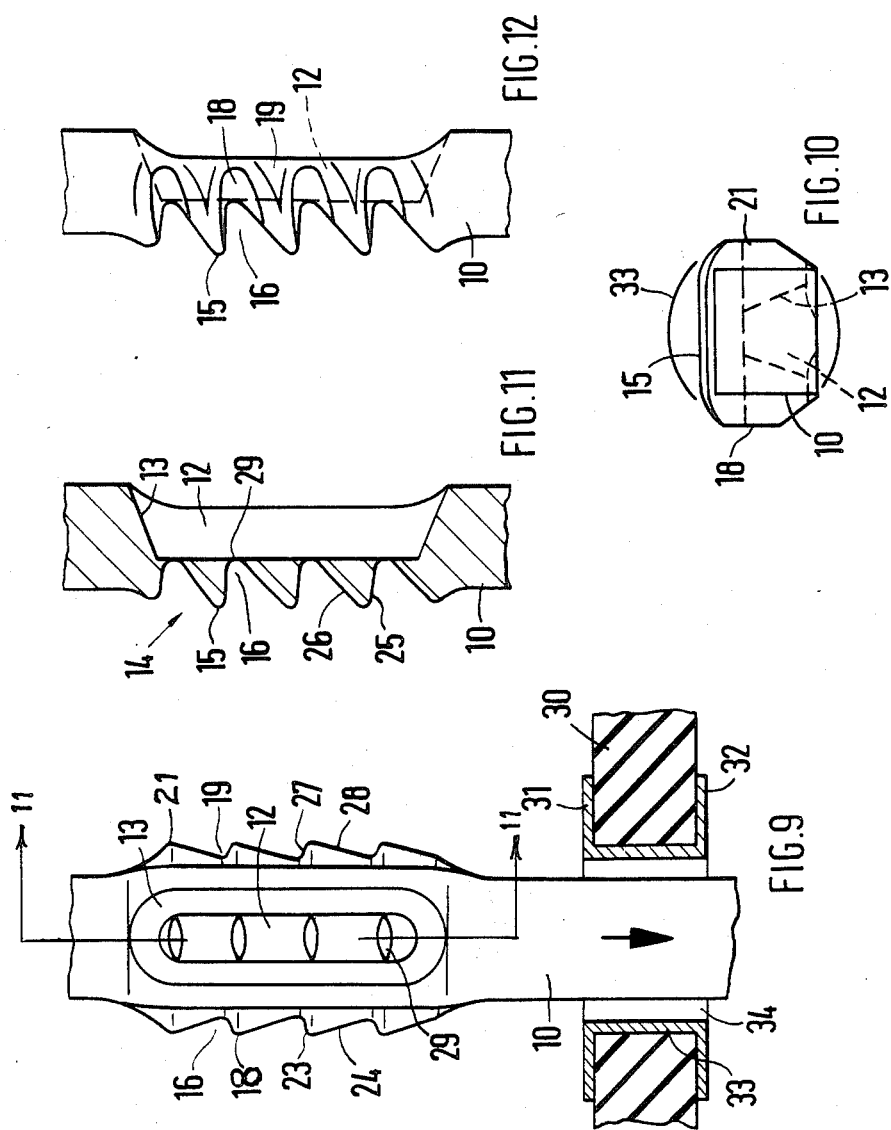

TERMINAL CONNECTION PIN FOR SOLDERLESS CONNECTIONS

BACKGROUND OF THE INVENTION

1. Field of the Invention

This invention relates to a terminal connection pin for solderless connections having a press-fit section which can be inserted into a contact through bore of a printed circuit board with a press-fit to provide a solderless electrical and mechanical connection between the terminal connection pin and the contact through bore of the printed circuit board, where the press-fit section is an extension of a connection pin having a generally square cross section with a groove parallel to its longitudinal axis and forms at least two axial contact paths opposite each other and having a limited flexibility.

2. Description of the Prior Art

To fasten solderless terminal connection pins in printed circuit boards without soldering and to connect them at the same time with the contact through bore, it is known in the art to shape a certain section of the shaft of such terminal connection pins, which usually have a square cross section, so that they are held in the contact through bore having a standardized diameter by press-fitting. Thus, the press-fit section of the terminal connection pin is obtained by indenting one or two notches facing each other so that they form contact paths reaching beyond the shaft which are pressed into the contact bore of the printed circuit board and held there similar to a grooved dowel pin.

In a known configuration, the press-fit section may have a cylindrical shape and the groove extends across the press-fit section parallel to its longitudinal axis. The depth and width of the groove is greater than half the diameter of the cylindrical outer surface of the press-fit section, as taught in German Patent DE-PS No. 29 37 883.

The disadvantage of this configuration is the fact that the pressure distribution along the circumference of the press-fit section cannot be controlled sufficiently after it has been inserted, even if the lateral areas of the press-fit section around the groove have a limited flexibility due to the groove. While this prevents tearing of the printed circuit board in the contact through bore area, as sometimes happens with rigid press-fit sections, it is done at the expense of an undefined contact formation between the press-fit section and the contact through bore of the printed circuit board. The areas of the press-fit section remaining around the groove are still so rigid in an axial direction that they cannot adapt to irregularities and tolerances of the contact through bore in this direction.

European Patent Publication EP-OS No. 105 044 teaches a configuration wherein the press-fit section is divided by a separation into three legs which are at such angles to each other that a triple axial contact path is formed. In addition, the contact paths may have a groove in order to obtain several individual contact points per contact path across the thickness of the printed circuit board.

This prior art terminal pin has the disadvantage that when the press-fit section is pressed into a contact through hole of the printed circuit board the separation slots become elongated and thus create different conditions in the press-fit section which result in different holding and contact forces. Defined holding and contact forces with tight tolerances cannot be implemented with this configuration.

SUMMARY OF THE INVENTION

It is an object of this invention to provide a terminal connection pin of the type described above wherein the press-fit section can be shaped easily and ensures clearly defined, reproducible holding and contact forces with the contact through bore of the printed circuit board across the total length of the press-fit section.

The present invention achieves this objective by contouring the outer surfaces of the lateral areas and the rear area, with respect to a groove of the press-fit section, in the form of undulations with peaks and valleys oriented in an axial direction, where the distance between the peaks, which serve as contact points, corresponds to half the thickness of the printed circuit board and where the peaks of the rear area are aligned with the valleys of the lateral areas and the valleys of the rear area are aligned with the peaks of the lateral areas.

With this configuration, individual clearly defined contact points are formed along all contact paths, which points are distributed across the width of the printed circuit board. By offsetting the peaks and valleys in the lateral and rear areas, with respect to the groove of the press-fit section, the contact points thus provided may be shaped so that they extend sufficiently beyond the generally square cross section of the terminal connection pin without causing undesirable tensions in the area of the press-fit section which could lead to undefined conditions. In the area of each contact path, two contact points are established with the contact through bore. Separation slots in the area of the press-fit section are avoided.

One configuration provides that the peaks in the rear area which project beyond the cross section of the generally square terminal connection pin are smaller than the peaks in the lateral areas, and the establishment of contact and holding forces of the press-fit section is limited to two contact paths opposite each other which have sufficient flexibility to obtain correspondingly large holding and contact forces.

According to another configuration, insertion of the press-fit section into a contact through bore of a printed circuit board is further facilitated by providing different slopes for the sides of the peaks in the lateral areas of the press-fit section.

A further improvement is provided by a configuration wherein the peaks of the rear area have a steep slope towards the direction of insertion and a shallow slope away from the insertion side and that the peaks of the lateral areas have shallow slopes towards the insertion side and steep slopes away from the insertion side.

To provide the individual contact points with individual flexibility, one embodiment has deep valleys in the rear area with openings at the groove.

Another embodiment provides for the lateral areas of the press-fit section to have at least four peaks each extending in an axial direction, whereby the terminal connection pin can also provide an electrical and mechanical connection between the contact through bores of two printed circuit boards where one is placed on top of the other.

BRIEF DESCRIPTION OF THE DRAWINGS

This invention is described in further detail with the aid of embodiments illustrated in the accompanying drawings, wherein:

FIG. 1 shows a front view of one embodiment of a press-fit section of a terminal connection pin according to the present invention in relation to a printed circuit board;

FIG. 2 shows a top view of the terminal connection pin according to FIG. 1;

FIG. 3 shows a longtiduinal cross-sectional view through the press-fit section of the terminal connection pin through line 3—3 of FIG. 1;

FIG. 4 shows a side view of the terminal connection pin according to FIG. 1;

FIGS. 5-8 show another embodiment of a press-fit section of a terminal connection pin according to the present invention, each figure corresponding to the views shown in FIGS. 1-4, respectively;

FIGS. 9-12 show another embodiment of a press-fit section of a terminal connection pin according to the present invention, each figure corresponding to the views shown in FIGS. 1-4, respectively.

DESCRIPTION OF PREFERRED EMBODIMENTS

In all of the illustrated embodiments, a basic form material with a generally square cross section is used for terminal connection pin 10. As shown in FIGS. 1, 3 and 4, enlarged press-fit section 11 extends for a longitudinal axial length which is greater than the thickness of two printed circuit boards 30. Contact through bore 33 connects conducting pathways 31 and 32 on the two outer surfaces of printed circuit board 30. Aperture 34 of contact through bore 33 is circular and has a diameter which is larger than the diagonal dimension of the generally square cross section of terminal connection pin 10. Press-fit section 11 is provided by forming with a tool which creates groove 12 with sloped peripheral areas 13. The rear area 14 of press-fit section 11 is shaped by a tool in the form of undulations where the distance between peaks 15 is approximately half the thickness of printed circuit board 30. Peaks 15 are separated by valleys 16. The lateral areas of press-fit section 11, with respect to groove 12, are also contoured in the form of undulations, as shown by peaks 18 and 21 and valleys 19 and 22. In a longitudinal direction of press-fit section 11, peaks 15 of rear area 14 are aligned with valleys 19 and 22 of the lateral areas, and valleys 16 of rear area 14 are aligned with peaks 18 and 21 of the lateral areas of press-fit section 11 by a suitable tool. As is shown in FIG. 2, the extension of peaks 15 beyond the cross section of generally square terminal connection pin 10 is less than the extensions of peaks 18 and 21, so that only peaks 18 and 21 form contact points with contact through bore 33 when press-fit section 11 is inserted in aperture 34. Along the length of contact through bore 33, two contact points are always provided by peaks 18 and 21 in each lateral area. Groove 12 may be formed so deep and wide that the lateral areas with peaks 18 and 21 are sufficiently flexible to adapt to the dimension of contact through bore 33. The contact points have sufficient holding and contact forces and can individually adapt to the irregularities and tolerances of contact through bore 33. Peaks 18 and 21 of the lateral areas of press-fit section 11 are sloped towards the front and rear side of press-fit section 11, so that press-fit section 11 can be inserted into contact through bore 33 more easily with only the center apex of peaks 18 and 21 forming contact points, as can be seen from the view according to FIG. 4. Peaks 15 of rear area 14 do not form contact points in contact through bore 33; they are chosen in a manner which makes it possible to impart this extended form to peaks 18 and 21 of the lateral areas when forming press-fit section 11. As can be seen from the view of FIG. 1, groove 12 is rounded at its shorter sides and is surrounded by a sloped peripheral area 13.

Peaks 18 and 21 are aligned with one other on the outer sides of press-fit section 11 to provide a contact area having an axial dimension greater than the diameter of contact through bore 33. Depending upon the dimensions of groove 12, the elasticity and flexibility of the lateral areas with peaks 18 and 21 may be determined, and thus the holding force of press-fit section 11 in contact through bore 33 and the contact forces of the contact points formed by peaks 18 and 21 may also be determined. When inserting press-fit section 11 into contact through bore 33, there is no variance in configuration, so that the conditions provided by the groove determine the holding and contact forces in a definite and reconstructible manner with the individual contact points being able to adapt to the conditions of individual contact through bores 33.

In the embodiment shown in FIGS. 5-8, the situation is similar. However, peaks 15, 18 and 21 have sides facing the direction of insertion and facing away from the direction of insertion provided with different slopes. Sides 25 of peaks 15 in rear area 14 facing the direction of insertion have a steep slope, while sides 26 facing away from the direction of insertion have a shallower slope. This configuration makes it possible to provide sides 24 and 28 of peaks 18 and 21, respectively, facing the direction of insertion a shallower ascending slope and sides 23 and 27 of peaks 18 and 21, respectively, a steeper descending slope. Together with the flexibility of the lateral areas of press-fit section 11, this makes it considerably easier to insert press-fit section 11 into contact through bore 33. This is advantageous if press-fit sections 11 of several terminal connection pins 10 are pressed simultaneously into corresponding contact through bores 33. Since rear area 14 of press-fit sections 11 does not come into contact with contact through bore 33, steeper sides 25 of peaks 15 in rear area 14 do not interfere with the insertion of press-fit section 11 into contact through bore 33.

In the embodiment illustrated in FIGS. 9-12, valleys 16 extend so far in rear area 14 that openings 29 occur in rear area 14. The distribution of peaks 15, 18 and 21 of press-fit section 11 is the same as in the embodiment shown in FIGS. 5-8. In addition, for sides 25 and 26 of peaks 15 and sides 23 and 27 and 24 and 28, respectively, of peaks 18 and 21, respectively, the same slopes were selected as shown in the embodiment according to FIGS. 5-8. Openings 29 in rear area 14 of press-fit section 11 considerably improve the adaptability of the individual contact points formed by peaks 18 and 21. The slopes of peaks 18 and 21 facing toward and away from the direction of insertion of press-fit section 11 are maintained, so that press-fit section 11 can be easily pressed into contact through bore 33. FIG. 10 shows once more that peaks 15 in rear area 14 of enlarged press-fit section 11 do not come into contact with contact through bore 33. Peaks 18 and 21 extend beyond the generally square cross section of terminal pin 10, so that the dimension of peaks 18 and 21 and therefore that of the contact points thus formed is greater than the diameter of contact through bores 33. When inserting press-fit section 11 into contact through bore 33, the lateral areas with peaks 18 and 21 can yield to an extent such that the apex areas of peaks 18 and 21 are held by tension in contact through bore 33. With a sufficiently large contact force of the contact points formed by peaks 18 and 21, a sufficiently large mechanical holding force for press-fit section 11 in contact through bore 33 is provided. The individual contact points can adapt to the irregularities and tolerances of contact through bores 33. When the distance between peaks 18 and 21 corresponds to half the thickness of printed circuit board 30 each lateral area of press-fit section 11 may be supported in contact through bore 33 by two contact points.

I claim:

1. Terminal connection pin for solderless connections comprising a generally rectangular pin with an enlarged press-fit section which is insertable into a contact through bore in a printed circuit board, said press-fit section providing a solderless electrical and mechanical connection by contact paths between said terminal connection pin and said contact through bore of said printed circuit board, said press-fit section having a central groove parallel to its longitudinal axis, and providing at least two said contact paths opposite one another and having a limited flexibility, characterized in that said press-fit section (11) has lateral areas and a rear area with respect to said groove (12), said lateral areas and said rear area surrounding said groove on three sides, and that said lateral and rear areas have undulations forming peaks (15, 18, 21) and valleys (16, 19, 22) in an axial direction, said peaks (18, 21) of said lateral areas providing said contact paths and the distance between said peaks (15, 18, 21) corresponding to half the thickness of said printed circuit board (30), and said peaks (15) of said rear area (14) are aligned with said valleys (19, 22) of said lateral areas and said valleys (16) of said rear area (14) are aligned with said peaks (18, 21) of said lateral areas.

2. Terminal connection pin as set forth in claim 1 characterized in that said peaks (15) in said rear area (14) extend beyond the cross section of said generally square terminal pin (10) to a lesser extent than said peaks (18, 21) in said lateral areas.

3. Terminal connection pin as set forth in claim 2 characterized in that said peaks (18, 21) of said lateral areas have different slopes on sides facing towards and away from the direction of insertion of said press-fit section (11).

4. Terminal connection pin as set forth in claim 3 characterized in that said peaks (15) of said rear area (14) have a steeper slope (25) on said sides facing towards said insertion side and a shallower slope (26) on sides facing away from the direction of insertion, and that said peaks (18, 21) of said lateral areas have shallower slopes (24, 28) on sides facing towards said insertion side and steeper slopes (23, 27) on sides facing away from the direction of insertion.

5. Terminal connection pin as set forth in claim 4 characterized in that said valleys (16) in said rear area (14) are deep and have openings (29) at said groove (12).

6. Terminal connection pin as set forth in claim 5 characterized in that said lateral areas of said press-fit section (11) have at least four peaks (18, 21) extending in an axial direction.

7. Terminal connection pin as set forth in claim 1 characterized in that said peaks (18, 21) of said lateral areas have different slopes on sides facing towards and away from the direction of insertion of said press-fit section (11).

8. Terminal connection pin as set forth in claim 1 characterized in that said peaks (15) of said rear area (14) have a steeper slope (25) on sides facing towards an insertion side and a shallower slope (26) on sides facing away from said insertion side, and that said peaks (18, 21) of said lateral areas have shallower slopes (24, 28) on sides facing towards the direction of insertion and steeper slopes (23, 27) on sides facing away from the direction of insertion.

9. Terminal connection pin as set forth in claim 1 characterized in that said valleys (16) in said rear area (14) are deep and have openings (29) at said groove (12).

10. Terminal connection pin as set forth in claim 1 characterized in that said lateral areas of said press-fit section (11) have at least four peaks (18, 21) extending in an axial direction.

* * * * *